United States Patent [19]
Homstad

[11] Patent Number: 4,902,398
[45] Date of Patent: Feb. 20, 1990

[54] COMPUTER PROGRAM FOR VACUUM COATING SYSTEMS

[75] Inventor: Larry E. Homstad, Minneapolis, Minn.

[73] Assignee: American Thim Film Laboratories, Inc., St. Paul, Minn.

[21] Appl. No.: 186,590

[22] Filed: Apr. 27, 1988

[51] Int. Cl.$^4$ .................. C23C 14/34; G06F 15/46
[52] U.S. Cl. .................. 204/298; 204/192.12; 364/469; 364/474.09
[58] Field of Search ........ 204/192.1, 192.12, 298 MT, 204/298 GF, 298 CS, 298 SC, 298 SM, 298 MC, 298 ND; 364/469, 471, 474, 474.09

[56] References Cited

U.S. PATENT DOCUMENTS

| | | | |
|---|---|---|---|
| 4,087,568 | 5/1978 | Fay et al. | 364/469 X |
| 4,172,020 | 10/1979 | Tisone et al. | 204/298 MT X |
| 4,767,516 | 8/1988 | Nakatsuka et al. | 204/298 SM X |

Primary Examiner—Nam X. Nguyen
Attorney, Agent, or Firm—Vidas & Arrett

[57] ABSTRACT

A computer program and method for controlling the coating of flexible materials in vacuum coating deposition systems.

16 Claims, 13 Drawing Sheets

Fig. 7
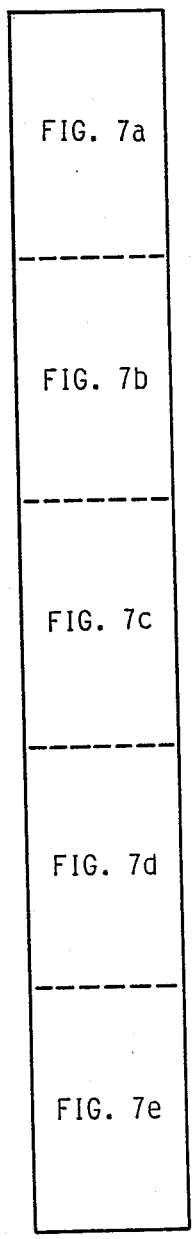
FIG. 7a
FIG. 7b
FIG. 7c
FIG. 7d
FIG. 7e
Fig. 9
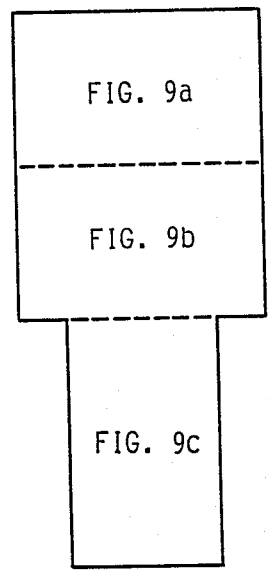
FIG. 9a
FIG. 9b
FIG. 9c

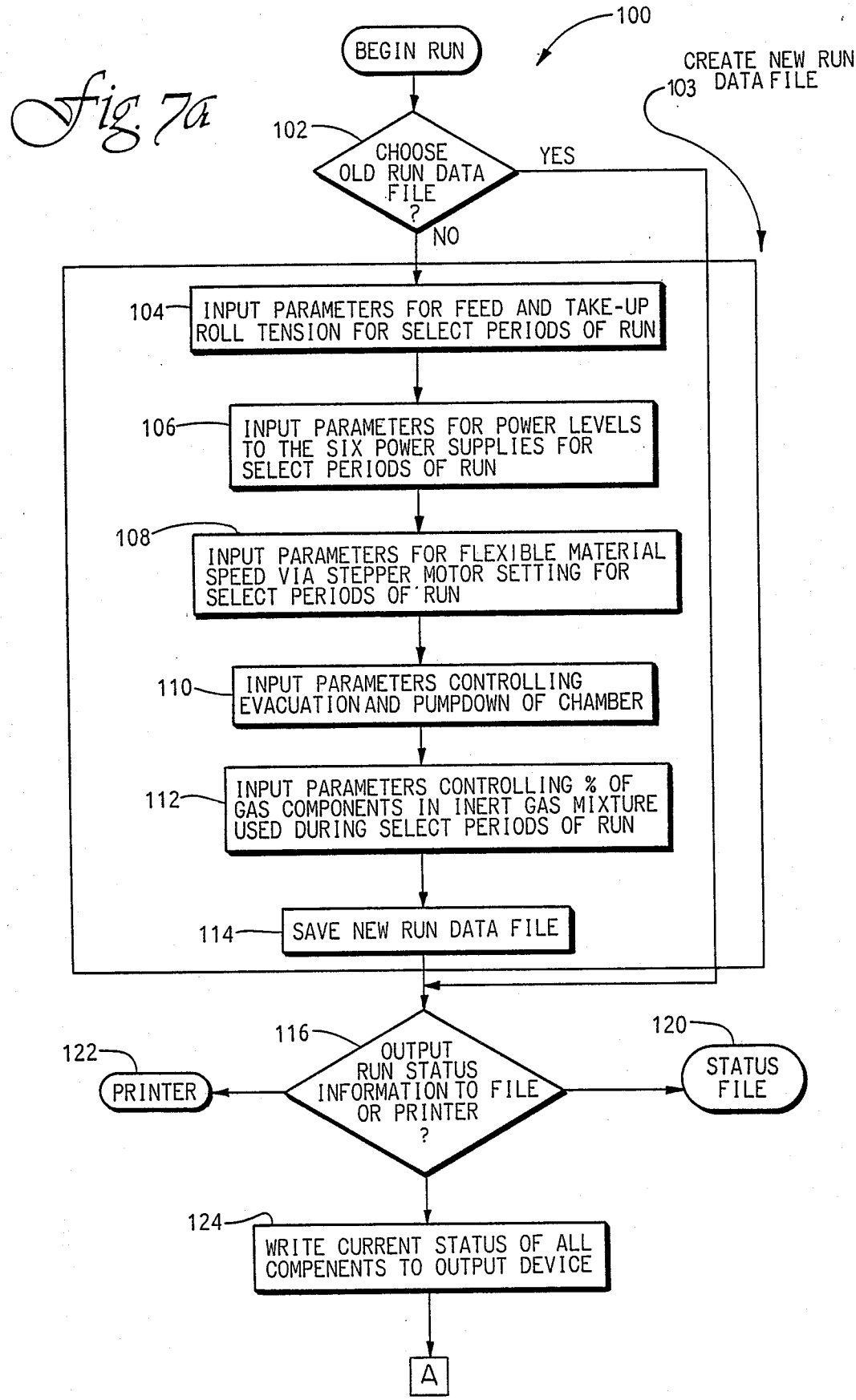

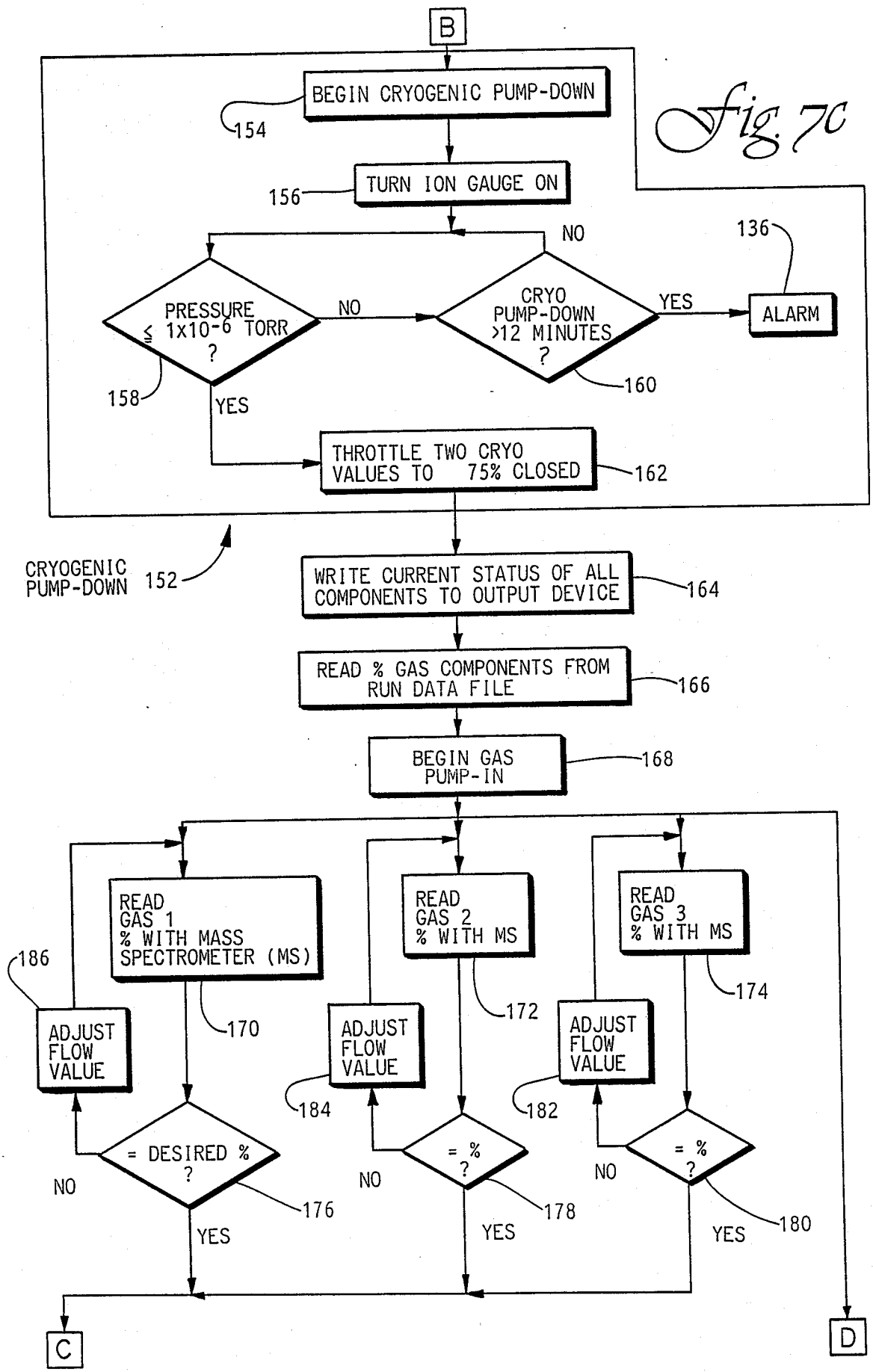

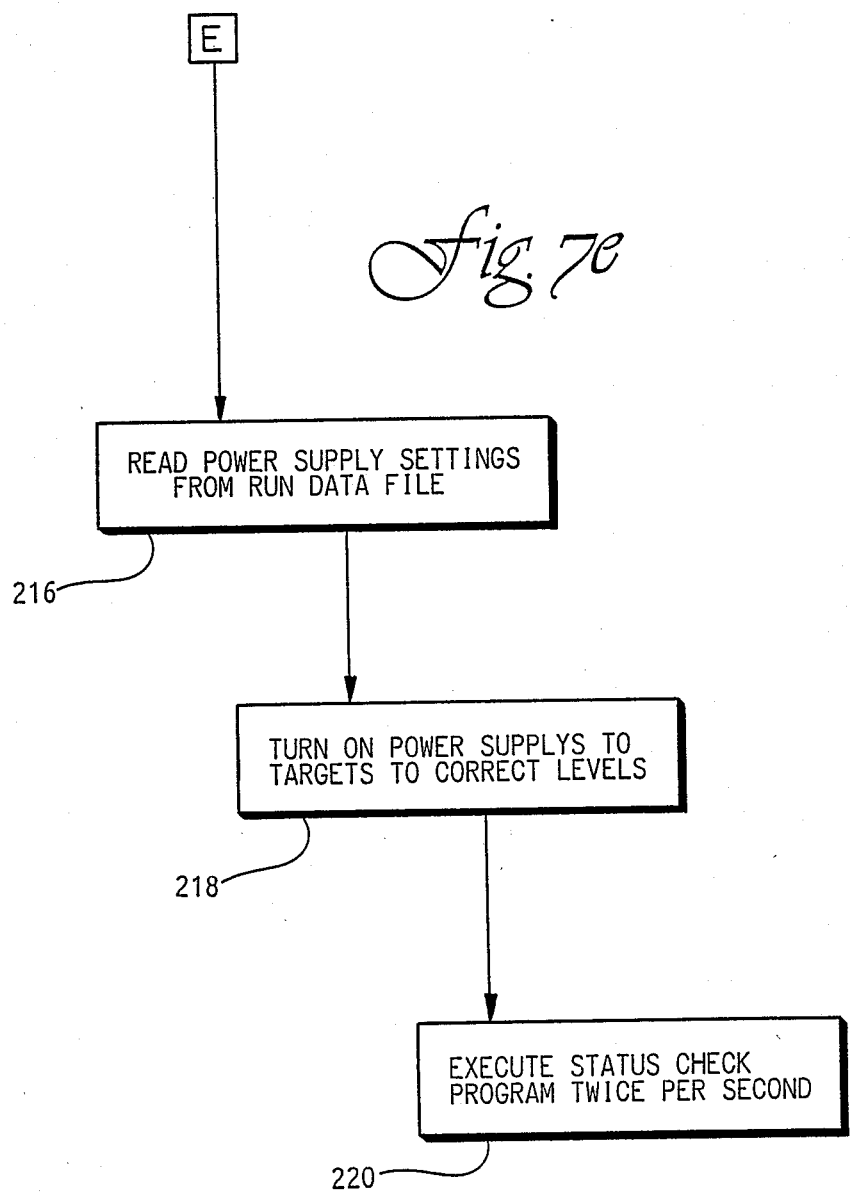

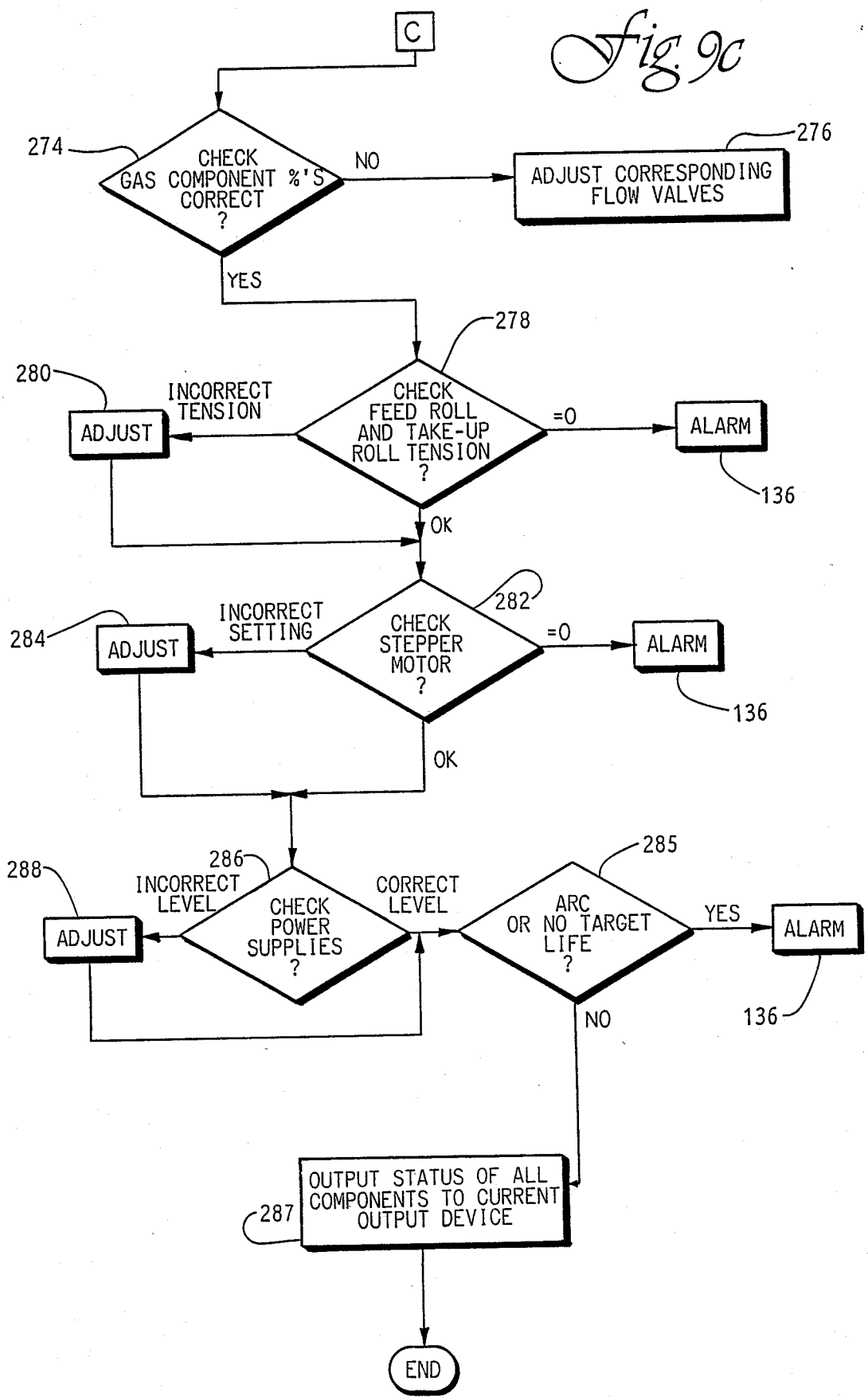

COMPUTER PROGRAM FOR VACUUM COATING SYSTEMS

RELATED APPLICATION

This application relates to U.S. application Ser. No. 186,587, entitled VACUUM COATING SYSTEMS filed of even date herewith by the same inventor and assigned to the same Assignee. That application is incorporated herein by reference.

BACKGROUND

This invention relates to thin film coating deposition systems of the vacuum coating type generally and more particularly to improved winding configurations used with roll coaters for use in vacuum coating systems, especially in sputtering vacuum coating systems. This application also discloses a computer program which controls the process of depositing a coating on flexible material used in the apparatus.

Vacuum coating deposition of thin films covers a broad class of coating processes in which material is removed from a source and deposited on a substrate, the process being carried out in a vacuum or partial vacuum. For example, when one considers vapor deposition one will include chemical vapor deposition in which gaseous chemical compounds react and deposit on heated substrates. In ion vapor deposition, an inert or plasma forming gas is ionized and a high negative potential is applied to the substrate or material to be coated. The coating metal is melted and vaporized then ionized to accomplish the coating procedure.

Lastly, there is physical vapor deposition in which material is physically removed from a source by evaporation or sputtering, transported through a vacuum or partial vacuum by the energy of the vapor particles and condensed as deposited coating or a film on the surface of a material. A myriad of physical vapor processes are known including diode or triode sputtering planar or cylindrical magnetron sputtering, direct current or radio frequency sputtering, electron beam evaporation, activated reactive evaporation and arc evaporation. This invention most specifically relates to sputtering and will be specifically described with reference thereto.

When rolls of flexible substrate material are to be coated by vacuum deposition, the process is referred to as "roll coating". This invention most specifically relates to roll coating. Typically, rolls of polyester or polyimide are used as flexible substrates in roll coating although a wide variety of other roll materials may be used including other plastic films, metallized papers, fabrics and even sheet metals. The improved roll coater and winding configuration of the invention is broadly applicable for use in all of the various vacuum coating procedures including chemical vapor deposition and ion vapor deposition as well as physical vapor deposition processes. However, it is described herein particularly with respect to the sputtering process as applied to roll coating.

In a typical roll coater, a roll of flexible substrate material, also known as a web, is carried on a feed roll. The substrate is threaded or led through various idler, drive and tension control rolls, passed through the coating region and taken up on a take-up roll after being coated. The apparatus is operated in a vacuum chamber.

A pumping system evacuates the vacuum chamber to a low pressure, for example approximately $1.0 \times 10^{-6}$ torr or so. After evacuation is attained the chamber is backfilled with a plasma forming gas, typically, argon, to a pressure of $2.0 \times 10^{-3}$ torr or so.

In roll sputtering, as in the preferred embodiments of this invention, the flexible substrate passes through a cloud of charged particles at a specific rate. Positively charged ions in a plasma (cloud of charged particles) strike a negatively biased source target, causing metal atoms to be ejected from the target toward the substrate surface. The ejected metal atoms strike and adhere to the substrate, forming a thin coating. After the entire roll is coated, the vacuum chamber is opened and the coated roll is removed.

SUMMARY OF THE INVENTION

Generally, sputtering is the deposition of materials under vacuum onto substrates. Sputtering differs from vacuum metallizing (evaporation) in that the material is removed from a solid cathode or source target instead of being vaporized by a heating source. Rapidly moving gas ions in the vacuum chamber strike a negatively biased source target causing metal atoms to be ejected through a transfer of momentum. Subsequently, the target atoms strike and adhere to the substrate surface forming a thin coating.

Some of the more common sputtering methods are planar diode, triode, magnetron and ion gun sputtering, all of which are adaptable to the subject invention. Direct current discharges are generally used for sputtering conductive substrates; a radio frequency (RF) potential is applied to the source target to sputter nonconducting substrates. Reactive sputtering can be performed with the addition of small controlled amounts of a reactive gas, such as oxygen to argon.

In its preferred embodiment, this invention is concerned with vacuum coating systems for sputtering thin films of various materials onto flexible substrates in which a roll of flexible substrate material (web) with a leader portion is set up; the leader portion is led through a roll handling mechanism, which includes a pair of chill drums, in a predetermined path to expose both sides of the substrate for coating by source targets. Then the coated substrate is moved to a take-up roll. In operation, the system is evacuated; sputtering gas(es) are bled into the system; the roll mechanism is started; the source targets are turned "on"; the flexible substrate winds through the mechanism and receives the deposition coating on both sides as it passes between the source targets and the chill drums. When all of the flexible substrate has been coated, the vacuum valves are closed and the system is vented with a clean dry gas, such as nitrogen. The coated substrate may then be transferred from the take-up roll to another core for subsequent handling.

All of the operations described may be preprogrammed and computer controlled; the system can be operated in a fully manual or automatic mode. Vital functions have feedback and active control when under computer control and data is updated preferably twice per second; control signals output at the same rate. The system provides "pinhole-free" deposited thin films of various materials.

BRIEF DESCRIPTION OF THE DRAWINGS

FIGS. 7(a)–7(e) together detail the control program;

FIG. 7(a) is a flow chart of the initial portion of the deposition control program, including the create new run data file portion;

FIG. 7(b) is a flow chart of the mechanical pump-down portion of the computer program;

FIG. 7(c) is a flow chart of the cryogenic pump-down and the gas pump-in portions of the computer program;

FIG. 7(d) is a flow chart of the tensioning portion;

FIG. 7(e) is a flow chart of the power supply portion of the program and the execution of the status check program;

FIGS. 9(a)–9(c) together detail the status check program;

FIG. 9(a) is a flow chart showing the choice of monitoring, and

FIG. 9(b) and 9(c) are flow charts showing the monitoring of the components of the system.

DESCRIPTION OF THE PREFERRED EMBODIMENTS

Figure 1:
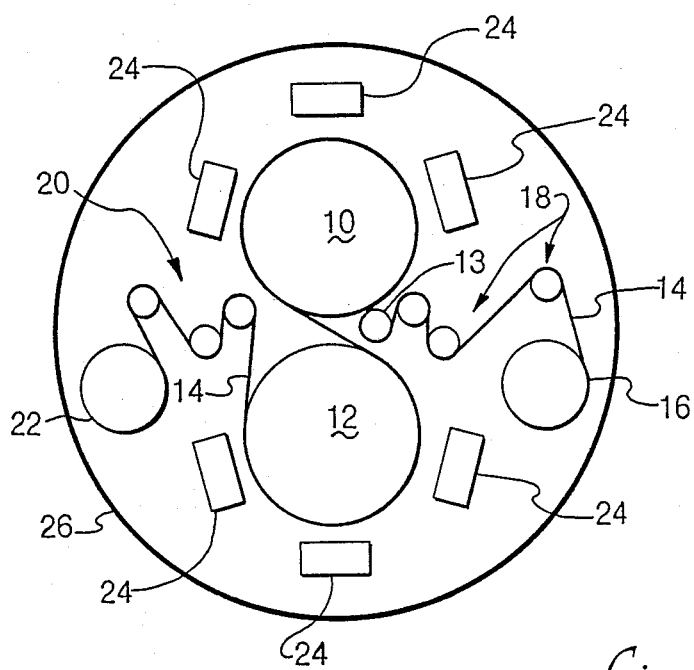
FIG. 1 is a schematic showing of the improved winding configuration in a roll coater operating in a vacuum environment.

As already indicated, the preferred embodiment of the invention involves a sputtering deposition system including a roll coater of improved winding configuration as shown schematically in FIG. 1. That Figure shows two oppositely disposed chill drums 10 and 12 positioned one above the other preferably directly above and below each other (side by side is also operable). Preferably the apparatus is driven, as by a stepper motor 13, while the other drums idle and rotate with the movement of substrate material over their surface. Stepper motor 13 may be of the type supplied by Superior Electric Company of Bristol, Conn. as their Slo-Syn synchronous stepping motor type M172-FD-306 with a rating of 200 steps/revolution. Any relative positioning of the chill drums is acceptable so long as they allow the substrate to be coated to lie flat on both drums as it moves through the roll coater and so long as the path will include introduction of substrate 14 from a feed roll or the like 16 to a side portion of drum 10 on the same side of feed roll 16 as shown. Substrate 14 then extends over several idler/drive rolls generally indicated at 18 and extends upwardly over drum 10 and downwardly on its other side to cross the space between the drums and onto the side of drum 12 which is also on the same side as feed roll 16. Substrate 14 continues in a path which extends around the bottom portion of drum 12 and upwardly along its other side to another set of idler/drive rolls generally indicated at 20 and to a take-up roll 22. This winding configuration allows for maximum exposure of chill drum surface to a plurality of source targets 24 and for coating both sides of the substrate. Up to three source targets may preferably be positioned as shown with respect to each chill drum, allowing for multiple layer coating to take place. One or more target sources may also be used. Preferably three will be used. It is important to note that they may be positioned at an ideal angle of incidence with respect to the closest surface area of each drum i.e., at normal or perpendicular positions with respect thereto. Chill drums 10 and 12 are electrically isolated from the chamber 26 and may be biased or floated electrically. They are also provided with means for heating or cooling them.

Figure 2:
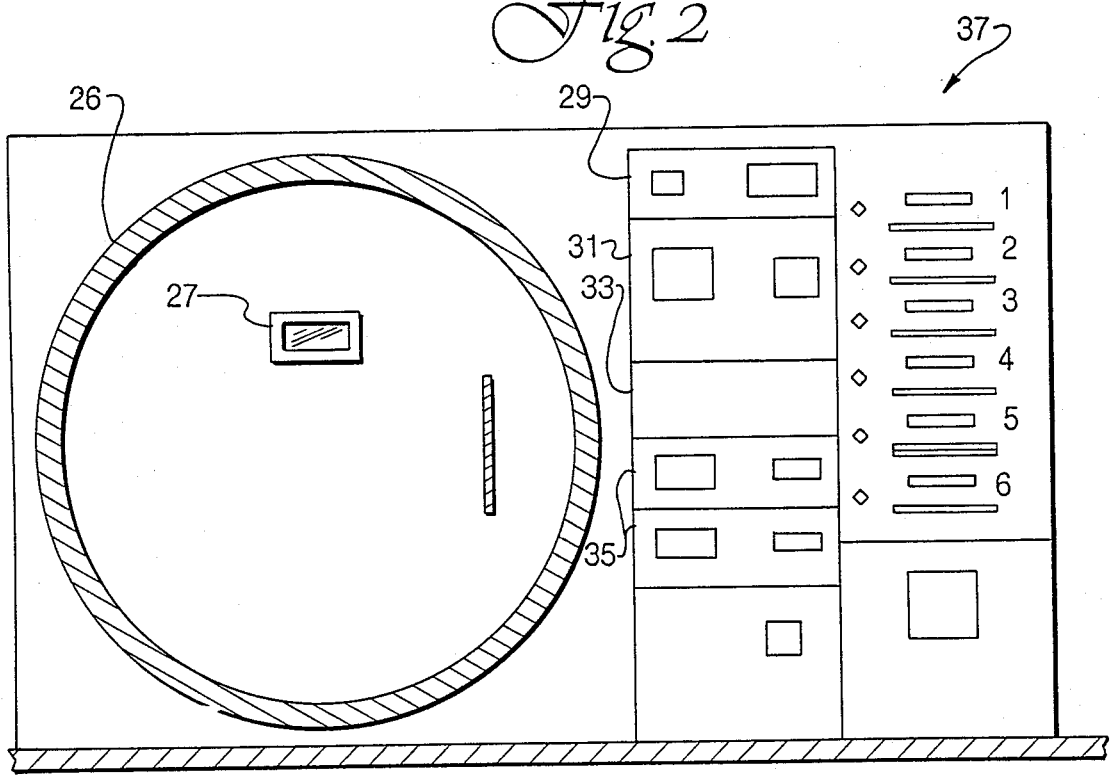
FIG. 2 is a schematic front view showing of the vacuum chamber and related controls.

Referring now to FIG. 2, a front view of the overall system with all the various instrument displays is shown. The ion gauge display is shown at 29. The manual valve sequencer display is shown at 31. The stepper motor display is shown at 33. The tension module displays are shown at 35. The six power supply displays are shown generally at 37. A viewport 27 allows for viewing of the process in the vacuum chamber during a run.

Figure 3:
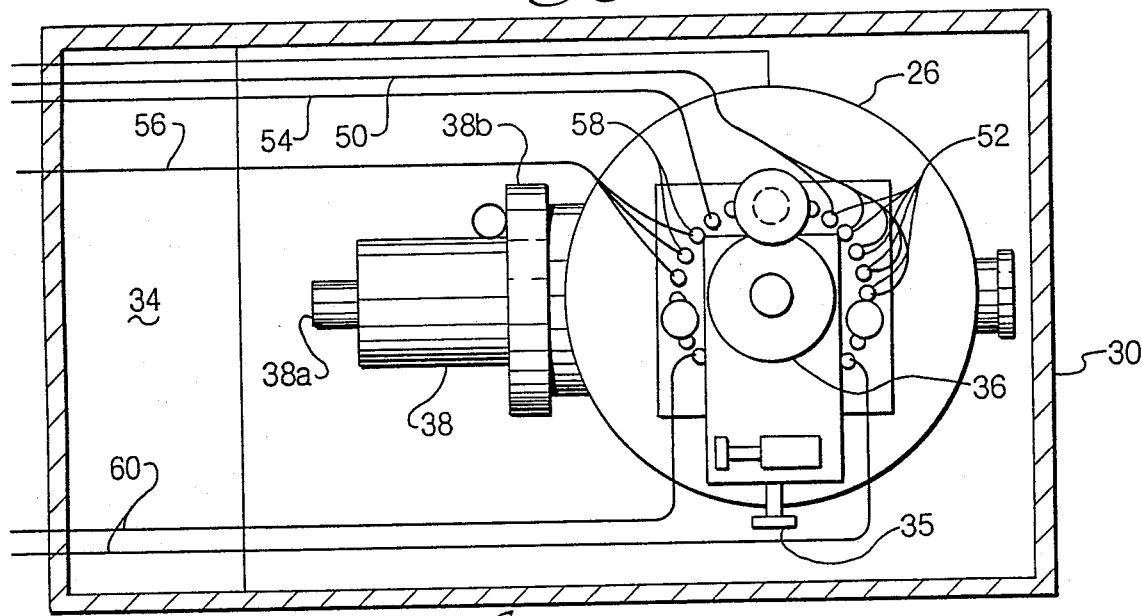
FIG. 3 is a schematic showing of the pumping arrangement and various lines (cooling, power, etc.) as they relate to the vacuum chamber.

Referring to FIGS. 3 to 6, a more or less typical installation is shown for the system in a schematic form to provide a general overview of a complete installation. As can be seen, particularly in FIGS. 3 and 6, the vacuum chamber 26 is preferably built into a wall 30 along one side of a clean room (not shown) forming an access room 34 behind wall 30. All pumps and services are accessed from room 34 behind the vacuum chamber. A vent valve 35 is shown at the bottom of chamber 26. This valve may be used to introduce a dry gas e.g., $N_2$ into the chamber following a coating run, in which case it would be suitably connected to a conduit arrangement (not shown). Room 34 contains cryogenic pumps 36 and 38 with their respective cold heads 36a and 38a (only 38a shown in Figures) and Hi-Vac valves 36b and 38b (only 38b is shown in FIG. 3). The Hi-Vac valves are preferably of the ten inch gate valve type supplied by Vacuum Research Corporation. Preferred pumps are CTI-10 Helium Cryogenic pumps and CTI-Cryogenic, Inc., 102R Helix Compressors. It also includes a roughing pump 40 (seen in FIG. 6) connected to Chamber 26 by valve 42. A preferred roughing pump is a Leybold- Heralus DK-200.

As is best seen in FIG. 3, computer feed back loops 50 extend into Chamber 26 via feedthroughs 52 to provide for computer control. Gas inlets and flow controls 54 also extend into chamber 26 via feedthroughs. Sensors and power inputs 56 extend into chamber 26 via feedthroughs 58. Also, heating and cooling lines 60 extend into chamber 26. Preferably, electrical power to the source targets enters the vacuum chamber and contacts the source targets by means of the input conduits which are of copper.

Figure 4:
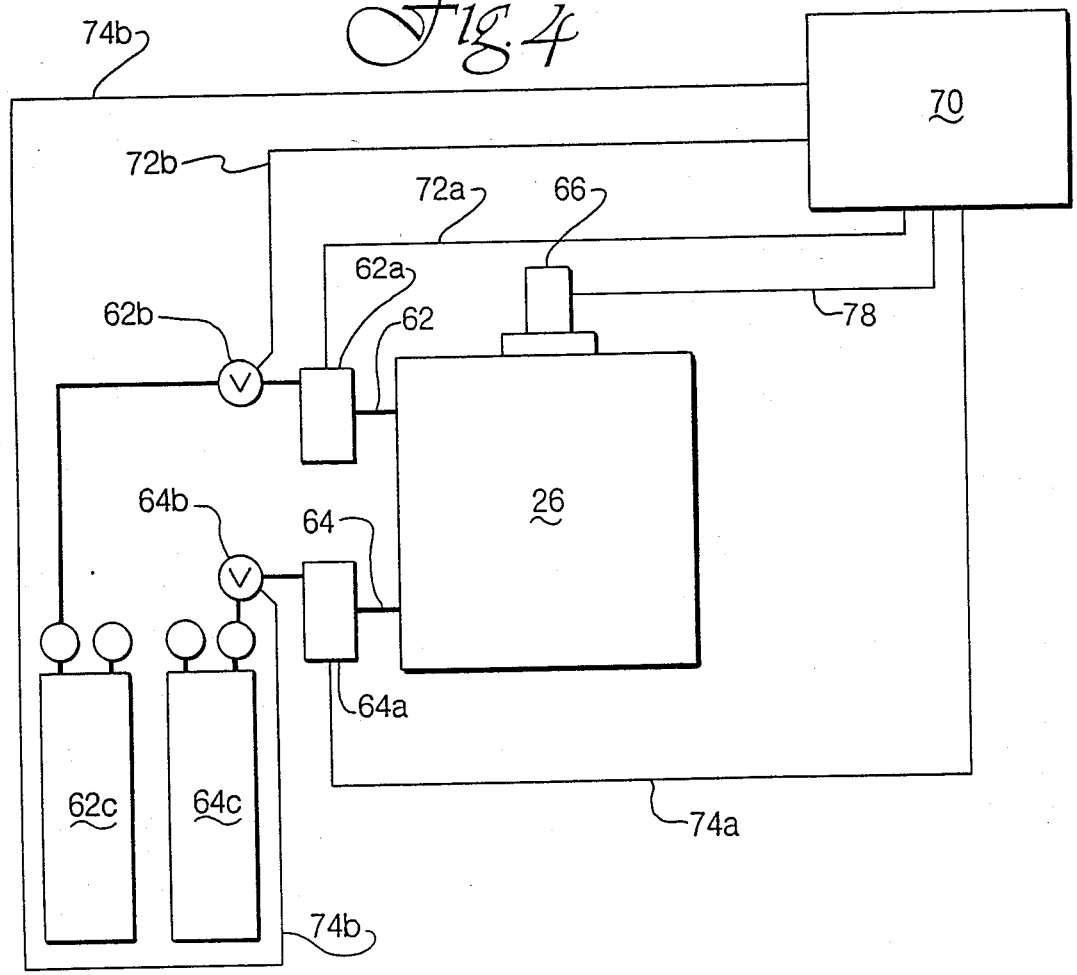
FIG. 4 is a schematic showing of the gas controls for the system.

Referring to FIG. 4, a gas control sub-system is shown. It includes vacuum chamber 26 to which gas inlet conduits 62 and 64 are connected. Conduit 62 extends to flow monitor 62a, to electrically operated metering valve 62b and to a gas container 62c which contains a first gas "A", such as argon. Conduit 64 extends to electrical flow monitor 64a, to an electrically operated metering valve 64b and a gas container 64c which contains a second gas "B", such as oxygen. One gas only may be used but two are preferred. However, it is contemplated that more than two gases could be used. It is also possible to use a third gas e.g.., nitrogen or carbon dioxide. A mass spectrometer 66 is connected to chamber 26 with its output connected to a computer 70 by input line 78. Computer output lines 72b and 74b attached to computer 70 extend to metering valves 62b and 64b, respectively. Input lines 72a and 74a extend to computer 70 from flow monitors 62a and 64a respectively. In operation, the desired ratio of gas "A" to gas "B" is set by computer 70, along with the total pressure. Data from the mass spectrometer 66 and the flow monitors 62a and 64a is used by computer 70 to adjust metering valves 62b and 64b, respectively, in order to achieve the proper mix.

Figure 5:
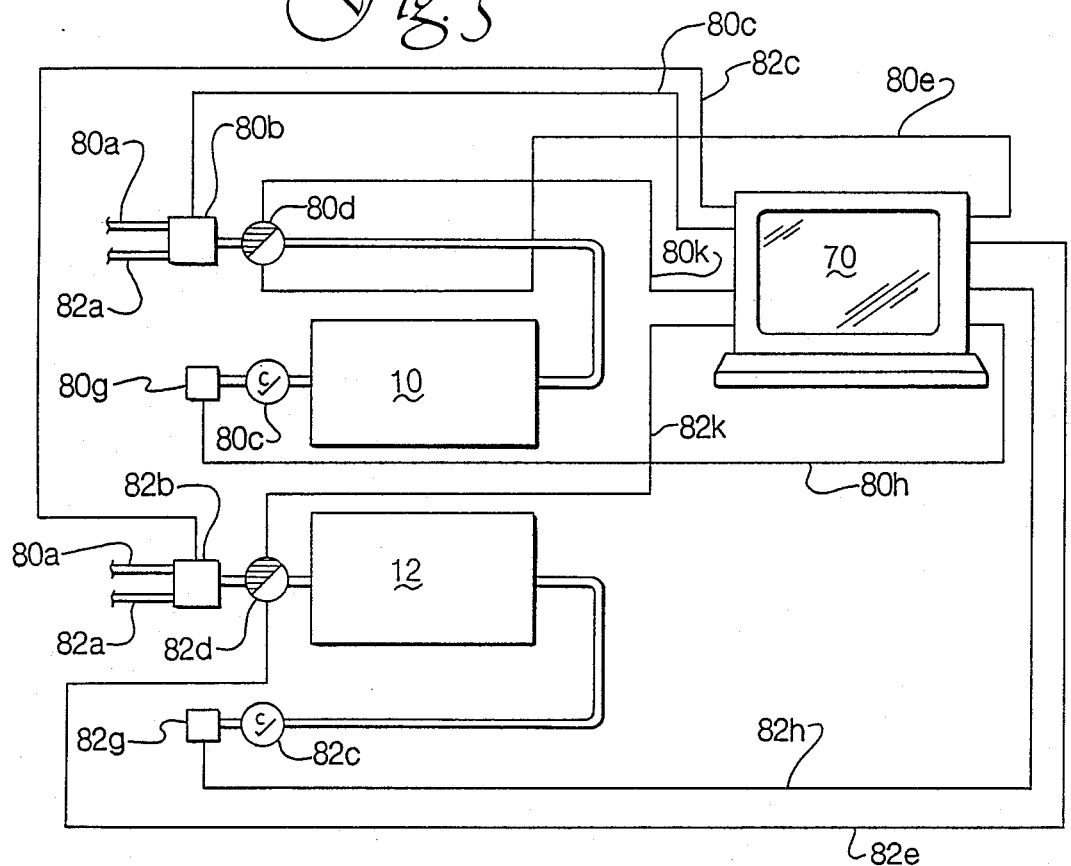
FIG. 5 is schematic showing of the temperature monitoring and control arrangement for the system along with the computer control.
Figure 6:
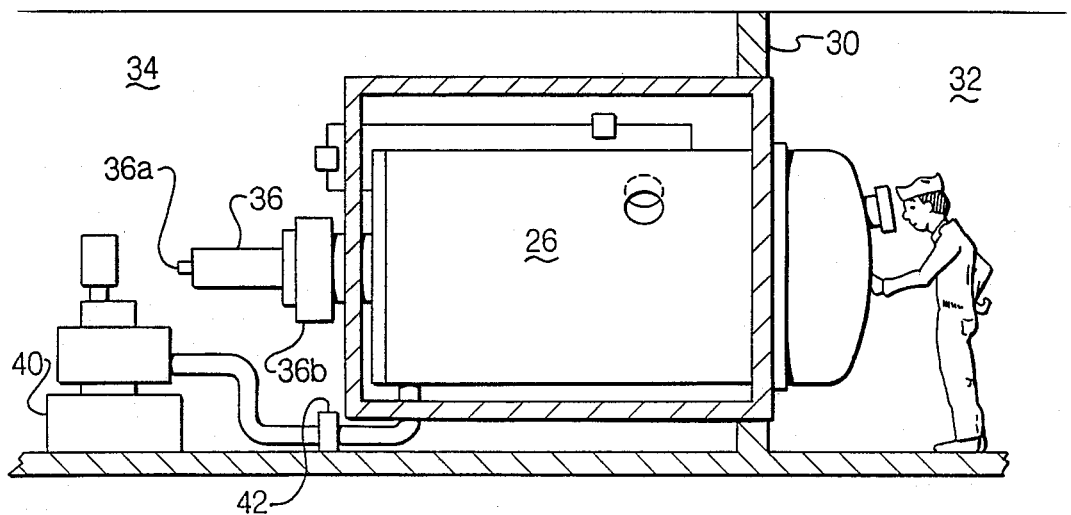
FIG. 6 is a schematic showing the overall installation.

Temperature monitoring and control of the chill drums 10 and 12 by computer 70 is shown schematically in FIG. 5. A source of heat and coolant flow (shown only schematically for simplicity) 80a and 82a respectively, is connected to each drum through electrically operated metering valves 80b and 82b, each of which is connected to computer 70 via output lines 80c and 82c. Preferably the heater (not shown) is of the type supplied by Watlow Company of Hannibal, Mo. as a Watlow heater model CBLC720L IOS2. The cooler (not shown) is preferably of the type supplied by Poly-Cold, Inc. of San Rafael, Calif. It is a freon chiller. Water is used in those devices as the working fluid. These items are shown here schematically only and are not specifically shown in subsequent Figures for the sake of simplicity. Flow of heat and coolant is controlled by a Flo-Tron 116 Series liquid flow control (not shown) and by thermocouple temperature monitor 80g and 82g operating through electrically operated flow valves 80d and 82d, respectively, and check valves 80c and 82c. Flow valves 80d and 82d are connected to computer 70 by input lines 80e and 82e, respectively. They are also connected to the computer by computer output lines 80k and 82k, respectively. Temperature is sensed by electrical sensors 80g and 82g which are connected to computer 70 by input lines 80h and 82h, respectively. Thus each chill drum can be controlled at its own predetermined temperature.

Figure 7B:
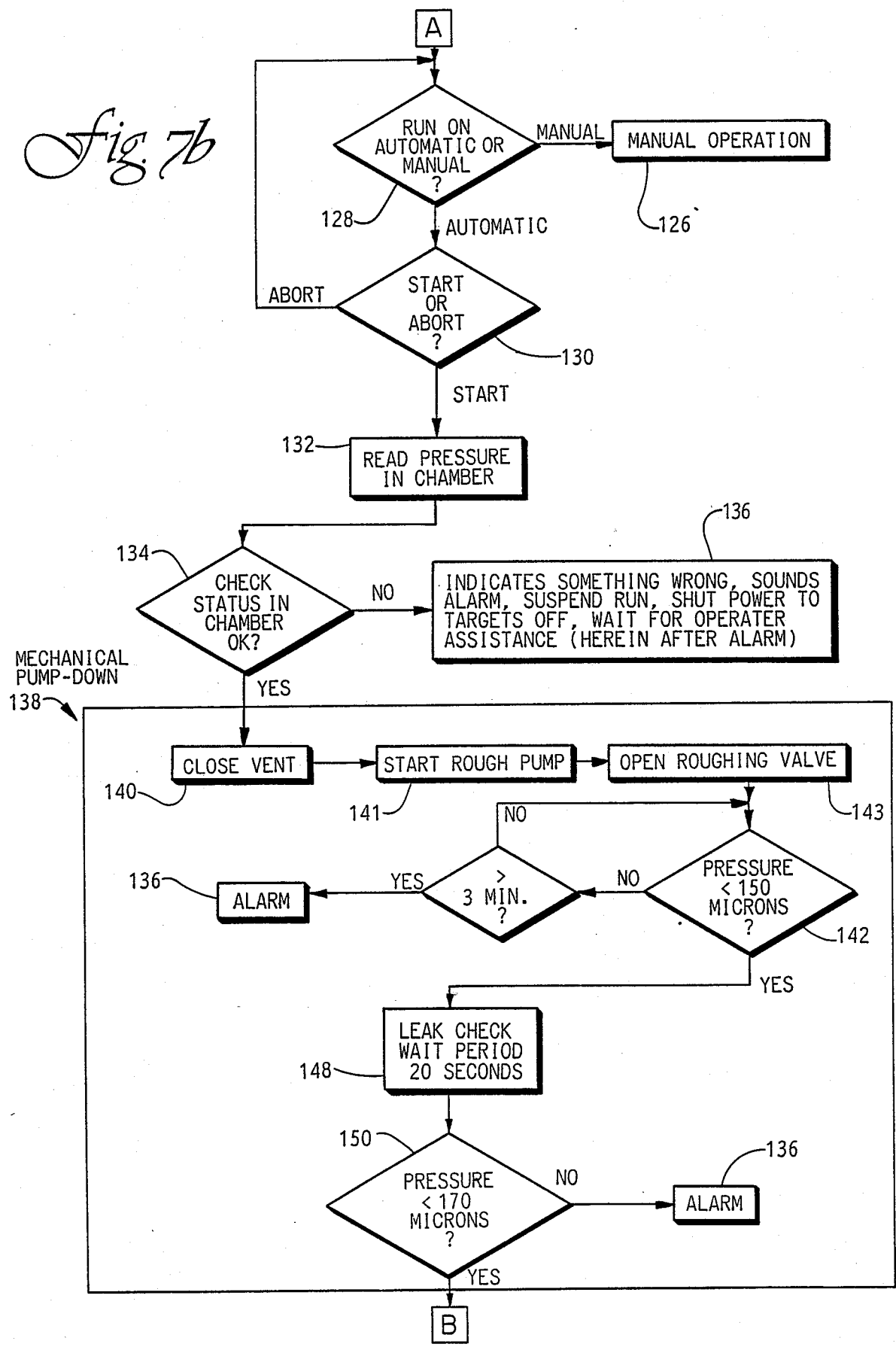
Figure 7D:
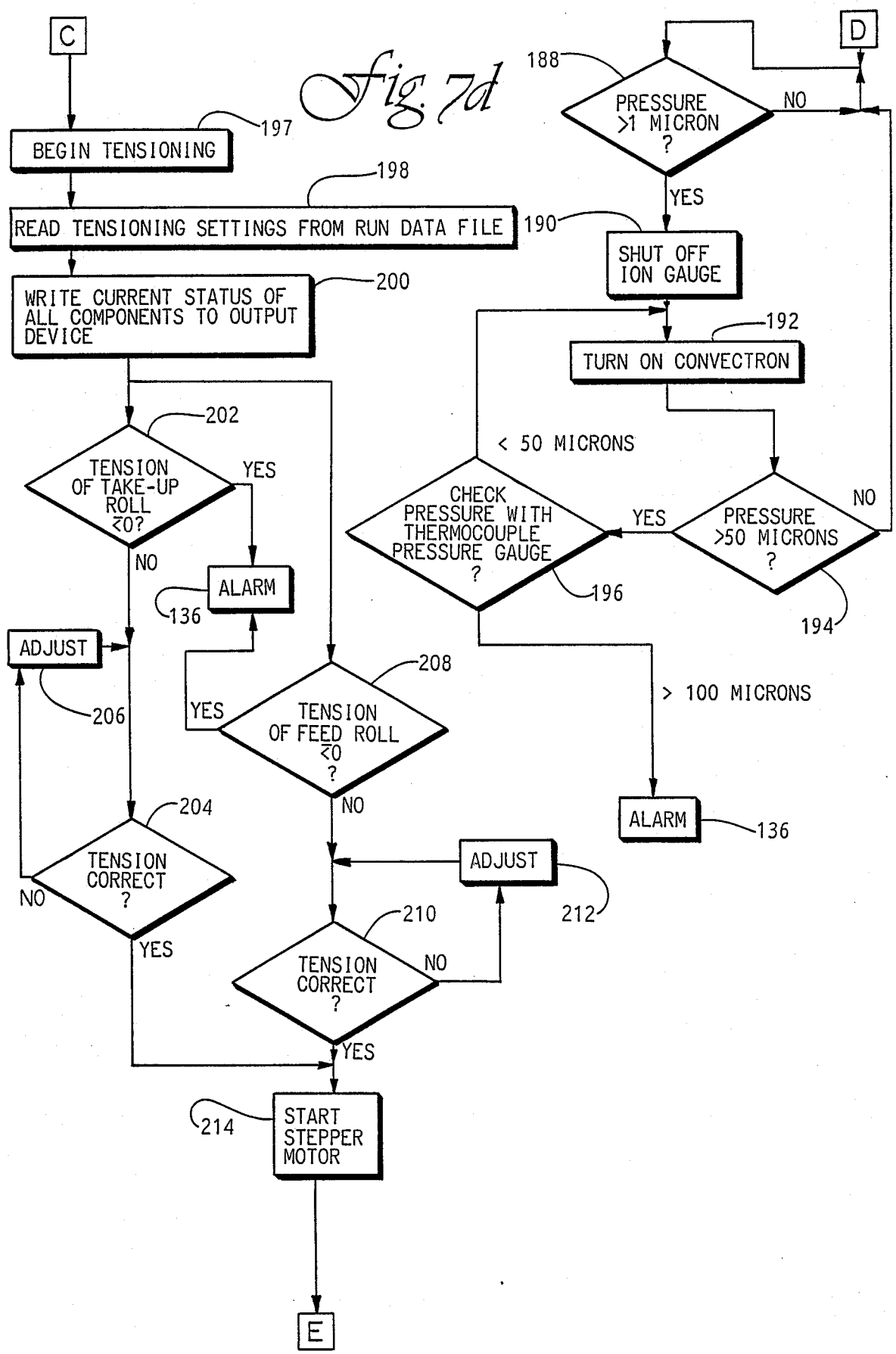

Referring now to FIG. 7, the beginning portion of the flow chart detailing the method steps, shown generally as 100, which controls the actual coating of flexible material is shown. The program is resident in the RAM portion (not shown) of computer 70. In the preferred embodiment the computer used to run the program is a CompuPro 8/16. Program 100 was written under the Oasis:Edition 2.0 operating system, manufactured by Phase One Systems, Inc. The program itself was written and compiled using a combination of machine language and Oasis Basic. It should be understood that any computer could be used, and the program could be ported to any language and run under any operating system.

At the beginning of a run, the flexible material or web to be coated is on the feed roll 16 and inside the chamber. The operator may select an old run data file at 102 when the computer program prompts the operator, or the operator may choose to create a new run data file. If the operator chooses to create a new run data file a series of questions must be answered, shown generally at 103. All of the results of these questions may be saved in a run file which then becomes available as a selection when the operator picks an old run file at 102. Once the series of parameters necessary to control a complete run is entered, it need not be entered again. This allows for greater efficiency when the coating system is to be used for repetitive coating procedures in which the same parameters are used again and again. All run data files allow the operator to vary the feed and take-up roll tension, the power levels of the power supplies, the speed at which the material to be coated moves through the system, the chill drum temperature, and the percentage component of each gas in the plasma forming gas mixture at various intervals throughout a run. This may be done either based on time, or actual length of material coated. For example, it may be desirable to turn the power on to one or more power supplies 10 minutes after the run has started, or 5000 feet into the run. Similarly, the mix of plasma forming gases may be changed anytime throughout the run, ranging from only one type of gas, to as many as three in the preferred embodiment. However, it is contemplated that any number of gases may be used in the mixture.

Once the data file has been chosen or created, the operator must determine where status data should be output, shown at 116. Program 100, and the status check program 118 (shown as FIGS. 9(a)–9(c)) periodically write a binary representation of the status of all the various components in the deposition coating system to an output device, which can either be a status file 120 stored on a storage device (not shown) such as a hard disk, or may be output to a printer 122. Block 124 is one such output of status information. However, it is to be understood that the output device may be any other typical output device such as a RAM disk, streaming tape, optical storage, or the like.

Referring to the next portion of FIG. 7, the operator must select whether to proceed on automatic mode or manually as shown at 128. Manual operation 126 consists of the operator physically selecting and performing the various tasks executed under program control when the program runs in automatic mode. Block 130 indicates that the operator must now abort the run or start the run. If the run starts the program reads the pressure in the chamber 26 using a thermocouple pressure gauge, which is accurate for gross pressure readings of the order from one atmosphere down to approximately 100 microns. Program 100 then checks the status of chamber 26 at 134 to determine if the chamber is ready to continue with the procedure. If there is something wrong, such as rapid pressure rise, incorrect valve placements, or no water flow then, as indicated in block 136; an alarm is sounded; the run is suspended; all power to the targets is shut off, and the run must wait for operator assistance. The actions shown in 136 are the same actions given throughout the program whenever an error occurs and will be referred to hereinafter as Alarm 136.

If the chamber is in condition to proceed, the mechanical pump-down (also known as rough pumping) may commence, indicated generally at 138. This consists of closing vent 35 shown in FIG. 3, and as method step 140, and starting the roughing pump 40 connected to the chamber by valve 42, shown as steps 141 and 143. The program periodically checks the pressure using the thermocouple gauge to determine if a pressure lower than 150 microns has been achieved. It should be understood that 150 microns is the preferred pressure based on the roughing pump used and could change as current technology improves the mechanical pump portion of the invention. If the pressure has not dropped to 150 microns within three minutes of mechanical pump-down commencement alarm 136 is executed. The three minute mechanical pump-down has been arrived at through experience as indicative of error in some part of the system, but could change depending on component changes in the deposition system. Once the 150 micron pressure has been attained wait period 148 is allowed to elapse to check for leaks in the chamber. The period is approximately 20 seconds in the preferred embodiment but could vary depending on different components used in the apparatus. Another pressure reading is taken with the thermocouple gauge as shown at 150. If the pressure is over 170 microns in the preferred embodiment alarm 136 is executed due to possible leaking of the chamber 26.

The next portion of FIG. 7 shows the cryogenic pump-down which executes next, shown generally at 152. During the cryogenic pump-down the two butterfly type valves 36b and 38b are fully open. An Ion gauge (not shown) is turned on at block 156. The ion gauge is a much more sensitive pressure measurement device, accurate at pressures less than 1 micron. Blocks 158 to 160 show a loop where the program determines if the pressure has dropped to $1.0 \times 10^{-6}$ Torr. If this target pressure is not reached in approximately 12 minutes alarm 136 is executed. It should be understood that the target pressure and time to reach it may vary. Once the desired pressure has been achieved valves 36b and 38b are throttled to approximately 75% closed to slow down the pump-in of the plasma forming gases and to avoid clogging the system by overloading the pumps, shown at step 162. Block 164 indicates that the system status is written to the current output device. The program next accesses the run data file to determine the percentages of each of the plasma forming gases contained in the gas mixture to be used in the chamber during coating. The preferred embodiment may utilize between one and three gases in the mixture. Typically they will be Argon, other Noble gases, Oxygen, Nitrogen, Carbon Dioxide, or other plasma forming gases. Three separate control loops execute during this portion of the control program. They are shown at 170, 172 and 174. Each one uses mass spectrometer 66 to measure the percentage component of the gases 1-3, determines whether the required percentage has been attained by comparison to data in the run data file, and adjusts flow valves 62b and 64b (a third valve is not shown as the preferred embodiment utilizes a mixture of only Argon (approximately 90%) and Oxygen (approximately 10%)).

During the pump-in of plasma forming gases a separate portion of the program monitors the pressure in the chamber. When the pressure increases above 1 micron the ion gauge is automatically shut off to avoid damage to the instrument at this high pressure, shown at 188. At this point a convectron type pressure gauge is turned on, shown at 190. The particular gauge used in the preferred embodiment is model 275 made by Granville-Phillips. A convectron pressure gauge is accurate between the range of 1 micron up to about 100 microns. If the pressure exceeds 50 microns, the thermocouple tests the pressure to cross check the accuracy of the convectron gauge and, if the pressure is over 100 microns, alarm 136 is executed due to the excess pressure in the chamber.

The last portion of the method steps in the deposition control program shows that the flexible material is tensioned, shown at 197. Relying on the tension settings found in the run data file, the feed roll and take-up roll tensions are set in control loops 202 and 208. If at any time during the entire run the tension drops to zero, alarm 136 is executed. Once the correct tension has been achieved, stepper motor 13 is started at a speed setting found in the run data file, shown at 214. As the material to be coated starts to move through the system, the power to the source targets are turned "on", shown at 218, to settings found in the run data file and obtained at step 216. Only those targets indicated in the run data file as being active are turned "on", and the power settings may vary individually for each target. Once the coating process starts, a status check program 118 is executed twice per second, shown at step 220. It is to be understood that the status check program 118 could be executed at any interval desired. It should also be understood that more than six source targets could be used in the invention.

Figure 8:
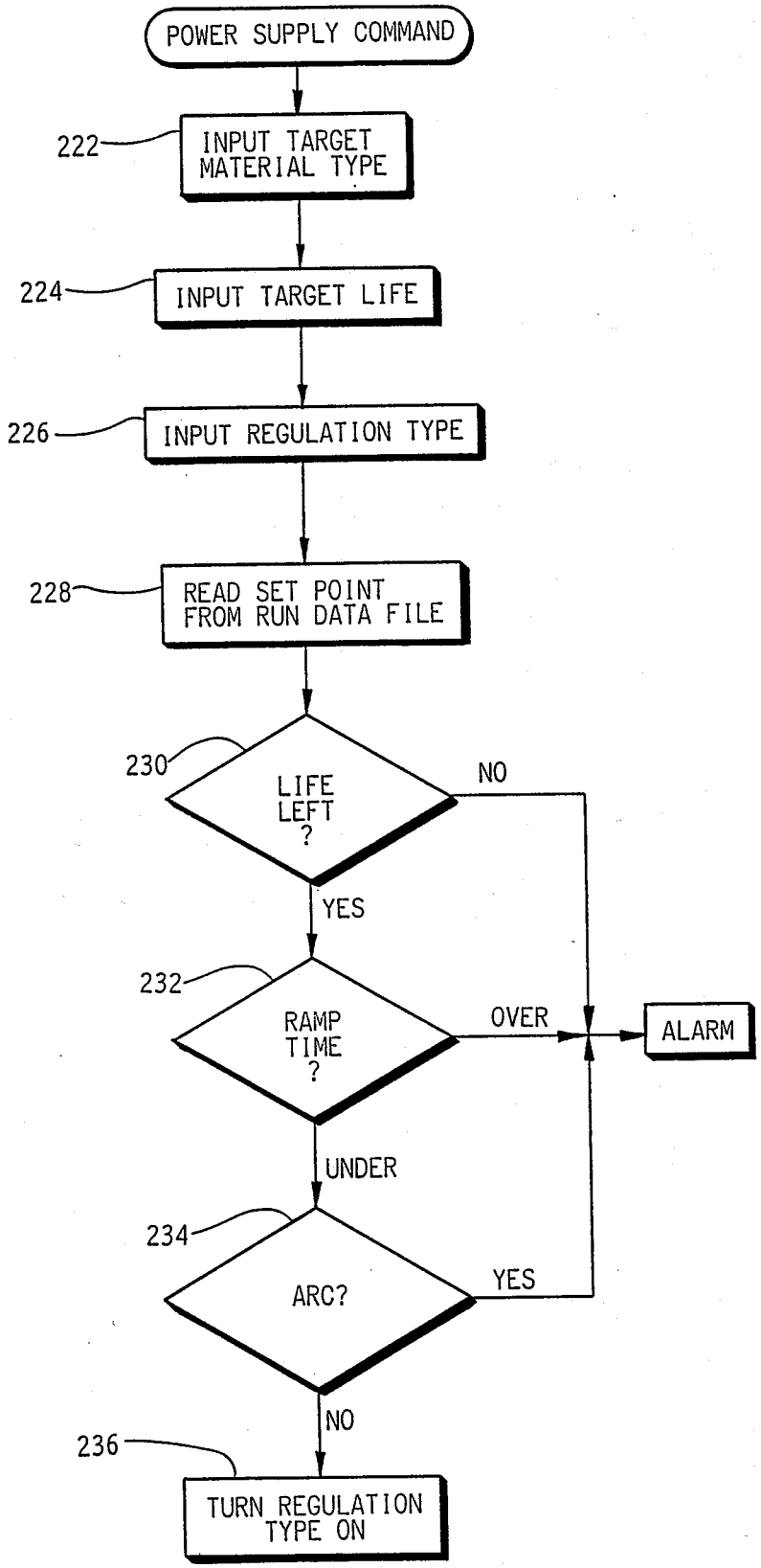
FIG. 8 is a flow chart of the power supply command program.

Referring now to FIG. 8, the power up of the power supplies is shown. This program is executed whenever the source target material is changed, or whenever the power supply is turned "on". When the source target material is changed, the source target type is input to the program, shown at 222. A source target life is input at 224. From then on a timer keeps track of the life of the target by decrementing a counter whenever the target is being sputtered. The power supply may be regulated by either power or current. The operator may select which regulation type to use at 226. The power supply supplies supply power between a range of 0.5 and 10 kilowatts to the target, depending on the speed of the material or web. This data is found in the run data file. As the power supply "powers up", the program measures the time it takes to reach the desired power level. If the ramp time takes longer than a predetermined time, usually on the order of 30 seconds, alarm 136 is executed. In addition, this program checks to make certain that there is still target life and that there is no arc occurring on the target. In either of these two instances alarm 136 is executed. Block 136 shows that the power supply regulation input above is turned on.

Figure 9A:
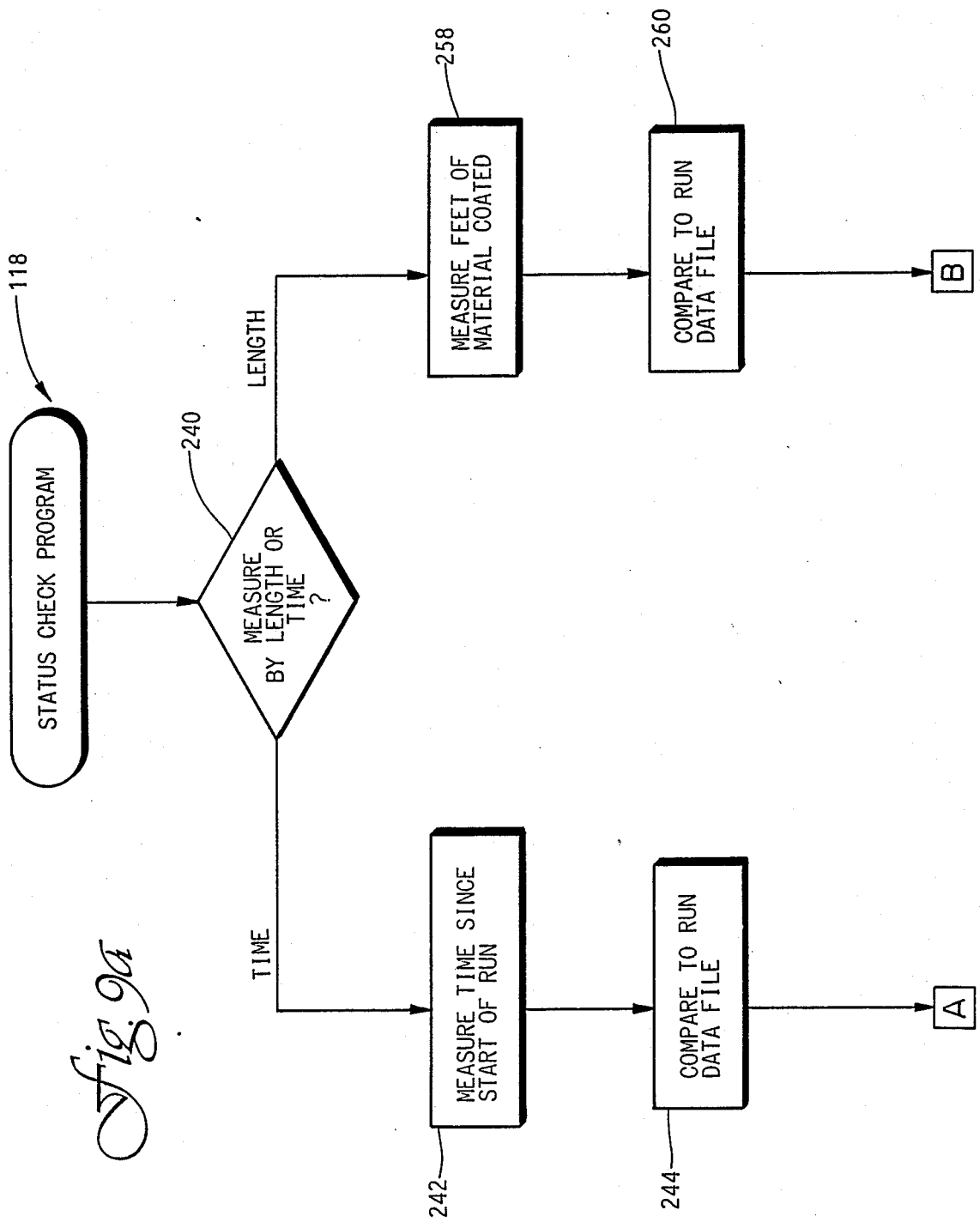
Figure 9B:
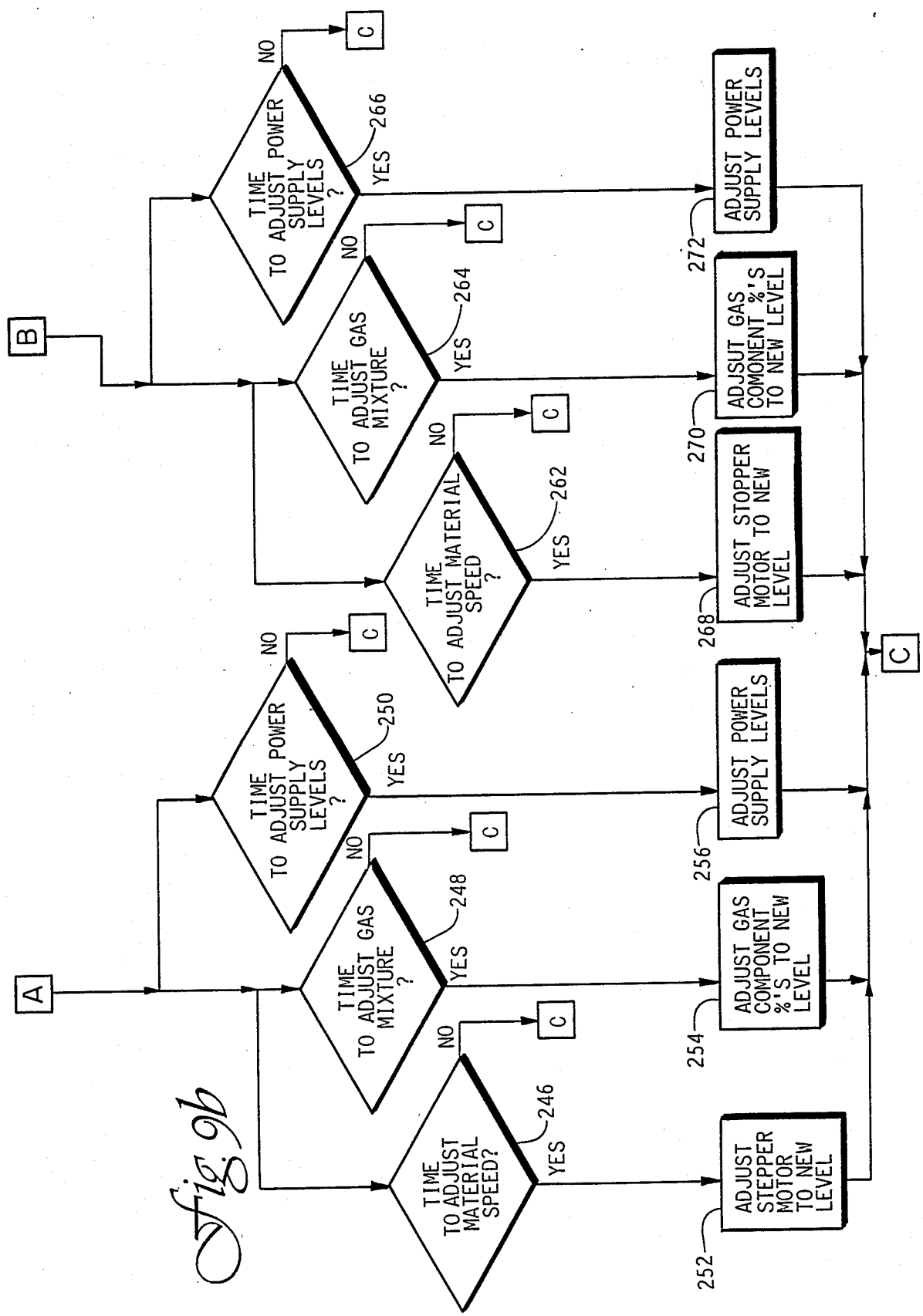

FIGS. 9(a) and 9(b) show a flow chart of the status check program which is executed twice per second in the preferred embodiment. This program performs many functions. It monitors the length of the run, and determines if any of the variables such as material speed, component gas percentage, chill drum temperature, or various power supply levels need to be modified based on data contained in the run data file. It may monitor the length of a run based either on the absolute time since the run commenced or the actual feet of material coated. The type of length of run measurement to be used is contained in the run data file.

The next portion of FIG. 9 shows how the status check program cycles through the various components one at a time to effect any changes required by the portion of the program shown in the first portion of FIG. 9, or in response to variations in the steady state of the various components. At 274 the program determines whether the gas mixture is still correct, utilizing mass spectrometer 66. If the mixture is not correct valves 62b and 64b will be closed or opened until the next execution of the status check program 118 when the mixture will be checked again. Similarly, at 278 the tension on the feed roll and the take-up roll is checked and adjusted as necessary. The stepper motor is checked at 282. Lastly the power supplies are checked at 286. If any alarm condition occurs the status check program finds it and executes alarm 136. For example, if the tension drops to zero, or the stepper motor setting is zero, or there is an arc on one or more of the targets. Block 287 indicates that the present status of all components is output to the current output device. The purpose of this is to provide an exact record of a run.

A similar method is used to monitor the temperature of chill drums 10 and 12. Metering valves 80b and 82b are connected to the computer by input lines 80c and 82c. The program determines whether the temperature of the chill drums is within proscribed limits for that portion of the run (as determined by the run data file). If the temperature needs to be altered, the status check program opens or closes the flow valves 80d, 82d and check valves 80c or 82c.

In actual operation a series of bits are stored at various address locations in RAM, which represent the status of the various components. The program has a range around each desired set point within which any value is considered as being at the set point. If the value gets outside this range, the status check program will execute subroutines operating the control lines to the various valves to alter the settings of all the components. Such methods are well known in the art of computer programming. It should be understood that any number of other operations could be checked and altered by the status check program simply by adding various subroutines which would control various components.

This completes the description of the preferred and alternate embodiments of the invention. Those skilled in the art may recognize other equivalents to the specific embodiment described herein which equivalents are intended to be encompassed by the claims attached hereto.

What is claimed is:

1. A roll coater and program control system for deposition coating, comprising in combination:
   a vacuum chamber;
   a pair of rotatable chill drums which are oppositely positioned one above the other so as to form a top drum and a lower drum and relative to each other such that a material to be coated lays flat on surface portions of each of the drums as the material moves over the drums;
   a feed roll positioned to one side of the drums for supplying a length of flexible material to be run over the drums and coated;
   a take-up roll positioned to the other side of the drums for receiving the coated material after it has run over the chill drums;
   drive means for moving the material from the feed roll and over the chill drums;
   a roll of flexible material carried on the feed roll and extending to the lower portion of the top drum on the side thereof on which the feed roll is positioned, the material extending upwardly, over the top of the top drum, down the other side of the top drum and crossing the space between the top and lower drum to extend downwardly over the side of the lower drum which the feed roll is positioned, around the bottom of the lower drum and upwardly over the other side of the lower drum and then to the take-up roll whereby the material is fed over the top drum in a first direction and is subsequently fed over the lower drum in a second and opposite direction, the drums counter rotating as the material moves over them to the take-up roll, opposite sides of the material being exposed on the respective drums for being coated as the material moves over the drums;
   means for positioning one or more source targets near each of the drums, to each side and at the top of the top drum and to each side and at the bottom of the lower drum whereby the angle of incidence of the source target surface of each source target maybe maintained substantially normal to that surface portion of the respective drums to which a source target is closest, and
   program means for operating said system, said program means comprising further means for:
   accessing a file of run data used to control the processing of the deposition at various times during a run;
   initiating the evacuation of the system chamber by operation of pump means;
   determining, by means of input signals to the program from sensor means, when the desired pressure has been reached in the system chamber;
   throttling valve means connected to the system chamber to a predetermined close point by means of output signals from the computer program;
   controlling the introduction of a gas into the system chamber, said program monitoring the chamber to maintain the gas at the predetermined value established by said run data;
   moving the flexible material through the system;
   turning "on" at least one source target at a predetermined power setting, said power setting determined by said run data, and
   depositing single or multiple layer coatings onto one or both sides of the flexible material as the material moves through the system.

2. The roll coater of claim 1 wherein the gas is a mixture, said mixture being determined by said run data, said program means additionally monitoring the system chamber so as to maintain the gas mixture components at the predetermined percentages established by said run data.

3. The roll coater of claim 2 wherein said program means additionally controls the system so as to:
   close said valve means after depositing a coating on said flexible coating, and
   vent the system chamber with a clean dry gas.

4. The roll coater of claim 2 where the run data file further includes data allowing for variation in said material speed, material tension, gas mixture, chill drum temperature, and source target power level, whereby these parameters may be varied during a run either by time since start of a run or based on the number of feet of flexible material coated.

5. The roll coater of claim 4 wherein the program means additionally controls the system so as to execute the program means at a predetermined interval during the coating process, wherein said program means monitors the time since the start of the coating of the material and compares the time to data in the run data file for determining if alterations must be made in material speed, material tension, gas mixture, chill drum temperature, or source target power level.

6. The roll coater of claim 5 where the interval at which the program means executes is twice per second.

7. The roll coater of claim 6 said program means additionally controls the system so as to save the information gathered by monitoring and transfer said information to an output device.

8. The roll coater of claim 4 wherein the program means additionally controls the system so as to execute the program means at a predetermined interval during the coating process, wherein said program means monitors the number of feet of material coated since the start of the coating of the material and compares that to data in the run data file for determining if alterations must be made in material speed, material tension, gas mixture, chill drum temperature, or source target power level.

9. The roll coater of claim 8 where the interval at which the program means executes is twice per second.

10. The roll coater of claim 9 wherein said program means additionally controls the system so as to save the information gathered by monitoring and transfer said information to an output device.

11. The roll coater of claim 2 wherein said monitoring is done with a mass spectrometer which interacts with the program means to maintain the correct percentage of gas mixture.

12. The roll coater of claim 11 wherein said program means additionally controls the system so as to monitor the status of the material tension such that if there is no tension on the material during a run all power to the active source targets is cut off.

13. The roll coater of claim 11 wherein the evacuation of said chamber is a two stage process comprising:
 a first mechanical pump means stage, and
 a second cryogenic pump means stage.

14. The roll coater of claim 13 wherein said program means additionally controls the system so as to detect, by means of input signals to the program means from sensor means, when the desired pressure at each stage has been reached in the system chamber.

15. The roll coater of claim 11 wherein the program means additionally controls the system so as to determine if the pressure in said chamber is falling at least at a threshold rate.

16. In combination, a roll coater for depositing single or multiple layer coatings onto one or both sides of a flexible substrate material using source target means, the roll coater being of the type having a vacuum chamber with a pair of rotatable chill drums positioned one above the other; pump means used to evacuate the chamber; sensor means to monitor the pressure in the chamber; and gas source means used to fill the chamber, and a computer program for operating a processor, the computer program comprising:
 program means configured to control a processor so as to:
  access a file of run data used to control the processing of the deposition at various times during a run;
  initiate the evacuation of the chamber by operation of the pump means;
  determine, by means of input signals to the program from sensor means, when a predetermined pressure has been reached in the chamber;
  control the introduction of a gas into the chamber, said program monitoring the chamber to maintain the gas at the predetermined pressure value established by said run data;
  initiate and control movement of the flexible material through the system;
  turn "turn on" the source target means at a predetermined power setting, said power setting determined by said run data, and
  deposit a coating onto the flexible material as the material moves through the system.

* * * * *

UNITED STATES PATENT AND TRADEMARK OFFICE
CERTIFICATE OF CORRECTION

PATENT NO. : 4,902,398
DATED : February 20, 1990
INVENTOR(S) : Larry E. Homstad

It is certified that error appears in the above-identified patent and that said Letters Patent is hereby corrected as shown below:

Col. 12, line 25, delete "turn "turn on"" and insert

-- turn "on" --

Signed and Sealed this

Twenty-second Day of January, 1991

*Attest:*

HARRY F. MANBECK, JR.

*Attesting Officer*    *Commissioner of Patents and Trademarks*